(12) United States Patent
Fujita et al.

(10) Patent No.: US 10,756,769 B2
(45) Date of Patent: Aug. 25, 2020

(54) TRANSMITTER AND TRANSMISSION/RECEPTION SYSTEM INCLUDING THE SAME

(71) Applicant: THINE ELECTRONICS, INC., Tokyo (JP)

(72) Inventors: Yusuke Fujita, Tokyo (JP); Satoshi Miura, Tokyo (JP)

(73) Assignee: THINE ELECTRONICS, INC., Chiyoda-ku, Tokyo (JP)

( * ) Notice: Subject to any disclaimer, the term of this patent is extended or adjusted under 35 U.S.C. 154(b) by 0 days.

(21) Appl. No.: 15/535,262

(22) PCT Filed: Dec. 28, 2016

(86) PCT No.: PCT/JP2016/089070
§ 371 (c)(1),
(2) Date: Jun. 12, 2017

(87) PCT Pub. No.: WO2017/119390
PCT Pub. Date: Jul. 13, 2017

(65) Prior Publication Data
US 2018/0316366 A1 Nov. 1, 2018

(30) Foreign Application Priority Data

Jan. 8, 2016 (JP) .................................. 2016-002721

(51) Int. Cl.
*H04B 1/04* (2006.01)
*H04L 25/02* (2006.01)
(Continued)

(52) U.S. Cl.
CPC ........... *H04B 1/04* (2013.01); *H03K 17/6871* (2013.01); *H04L 25/02* (2013.01); *H04L 25/028* (2013.01);
(Continued)

(58) Field of Classification Search
CPC .............................. H04B 1/04; H03K 17/6871
See application file for complete search history.

(56) References Cited

U.S. PATENT DOCUMENTS

| 7,233,177 B2 | 6/2007 | Hsu et al. |
| 7,522,670 B2 * | 4/2009 | Carballo ............. H04L 25/0272 375/257 |

(Continued)

FOREIGN PATENT DOCUMENTS

| CN | 1612481 A | 5/2005 |
| CN | 102064692 A | 5/2011 |

(Continued)

OTHER PUBLICATIONS

Froelich, "PCI Express 2.0 Electrical Specification Overview", 2006, PCI-SIG December PCIe Technical Seminar. (34 pages total).

(Continued)

*Primary Examiner* — Jean B Corrielus
(74) *Attorney, Agent, or Firm* — Sughrue Mion, PLLC

(57) ABSTRACT

This embodiment relates to a transmitter that has a structure to suppress an increase in device occupancy area on a semiconductor substrate. The transmitter includes an output driver, a duplication driver, a reference voltage generation unit, a first selection unit, a second selection unit, a comparison unit, and a control unit. The first selection unit selects a first or second test voltage outputted from a duplication driver in which a resistance value is set in cooperation with the output driver. The second selection unit selects a first or second reference voltage outputted from the reference voltage generation unit. The comparison unit compares magnitudes of the first test voltage and the first reference voltage during a first operation period and compares magnitudes of the second test voltage and the second (Continued)

reference voltage during a second operation period different from the first operation period.

4 Claims, 9 Drawing Sheets

(51) Int. Cl.
  *H03K 17/687* (2006.01)
  *H03K 19/0175* (2006.01)
(52) U.S. Cl.
  CPC ...... *H04L 25/0278* (2013.01); *H03K 19/0175* (2013.01)

(56) References Cited

U.S. PATENT DOCUMENTS

| 2006/0087339 | A1  | 4/2006 | Chung et al. |
| 2011/0037496 | A1* | 2/2011 | Ibaraki ............... H03K 19/0005 326/30 |
| 2014/0126665 | A1  | 5/2014 | Lee |

FOREIGN PATENT DOCUMENTS

| CN | 102223492 A | 10/2011 |
| EP | 1 471 702 A1 | 10/2004 |
| JP | H-2162915 A | 6/1990 |
| JP | H-10104281 A | 4/1998 |
| JP | 2001-503943 A | 3/2001 |
| JP | 2001-119441 A | 4/2001 |
| JP | 2003-298395 A | 10/2003 |
| JP | 2004-128759 A | 4/2004 |
| JP | 2006-74213 A | 3/2006 |
| JP | 2007-121288 A | 5/2007 |
| JP | 2011-211608 A | 10/2011 |
| JP | 2012-175416 A | 9/2012 |
| JP | 2014-230091 A | 12/2014 |
| JP | 2015-76655 A | 4/2015 |
| WO | 98/21859 A2 | 5/1998 |
| WO | 2006/022132 A1 | 3/2006 |

OTHER PUBLICATIONS

Suzuki, "Standard Trend and Measurement Solution of PCI Express", Jun. 24, 2015. (51 pages total).
International Search Report dated Mar. 28, 2017 issued by the International Searching Authority in PCT/JP2016/089070.
International Preliminary Report on Patentability with the translation of Written Opinion dated Jul. 19, 2018 issued by the International Bureau in No. PCT/JP2016/089070.

* cited by examiner

TRANSMITTER AND TRANSMISSION/RECEPTION SYSTEM INCLUDING THE SAME

This Application is a National Stage of International Application No. PCT/JP2016/089070 filed Dec. 28, 2016, claiming priority based on Japanese Patent Application No. 2016-002721 filed Jan. 8, 2016, the contents of all of which are incorporated herein by reference in their entirety.

TECHNICAL FIELD

The present invention relates to a transmitter and a transmission/reception system including the same.

BACKGROUND ART

Source series termination (SST) adopted in a transmitter is configured by connecting an output driver, a termination resistor, and a signal line of the transmitter side in series and can transmit a signal having large amplitude (for example, 1000 mVdpp) at a high speed (for example, 10 Gbps or more). A transmitter (hereinafter, referred to as the "SST transmitter") adopting the SST includes an output driver outputting a signal from a connection point of a first output circuit and a second output circuit each of which has a structure capable of changing a resistance value and output impedance of the output driver is varied.

The SST transmitter further includes a duplication driver. The duplication driver includes a first duplication circuit to be a duplication of the first output circuit and a second duplication circuit to be a duplication of the second output circuit. A circuit resistance value of the first duplication circuit is set to the same value as the resistance value of the first output circuit in cooperation with setting of the resistance value of the first output circuit and the first duplication circuit can output a first test voltage according to the set resistance value. In addition, a circuit resistance value of the second duplication circuit is set to the same value as the resistance value of the second output circuit in cooperation with setting of the resistance value of the second output circuit and the second duplication circuit can output a second test voltage according to the set resistance value.

In addition, in the SST transmitter, the resistance value of each of the first duplication circuit and the second duplication circuit is adjusted such that each of the first test voltage and the second test voltage approaches a target value or is within a target range. The resistance value of each of the first output circuit and the second output circuit is adjusted in cooperation with setting of the resistance value in each of the first duplication circuit and the second duplication circuit. As a result, the output impedance of the output driver is set to the target value or is set to be within the target range (refer to Patent Documents 1 and 2).

CITATION LIST

Patent Literature

Patent Document 1: European. Patent No. 1471702
Patent Document 2: Japanese Patent Application Laid-Open No. 2007-121288

Non-Patent Literature

Non-Patent Document 1: Dan Froelich, "PCI Express 2.0 Electrical Specification Overview", 2006, PCI-SIG December PCIe Technical Seminar Non-Patent Document 2: Katsuhiko Suzuki, "Standard Trend and Measurement Solution of PCI Express", [online], Jun. 24, 2015, [Jan. 8, 2016 search], Internet info.tek.com/rs/584-WPH-840/images/F-3_TIF2015_PCIe.pdf

SUMMARY OF INVENTION

Technical Problem

The inventors have examined the conventional SST transmitter and have found the following problems as a result thereof. That is, the inventors have found that, when a speed is increased in communication using the SST transmitter, an occupancy area (device occupancy area) of the SST transmitter formed on a semiconductor substrate increases, which results in increasing a manufacturing cost of the SST transmitter.

The present invention has been made to solve the above problems and an object thereof is to provide a transmitter having a structure to effectively realize both suppression of an increase in load capacity in the transmitter according to a high communication speed and suppression of an increase in device occupancy area on a semiconductor substrate due to the suppression of the increase in the load capacity and a transmission/reception system including the same.

Solution to Problem

A transmitter according to this embodiment is an SST transmitter and includes an output driver, a duplication driver, a reference voltage generation unit, a first selection unit, a second selection unit, a comparison unit, and a control unit to resolve the above problems. The output driver includes a first output circuit and a second output circuit to output a signal from an output terminal. The first output circuit has a structure capable of changing a first resistance value between a first potential terminal and the output terminal. The second output circuit is provided between a second potential terminal and the output terminal and has a structure capable of changing a second resistance value between the second potential terminal and the output terminal. The duplication driver is a duplication of the output driver cooperating with the output driver and includes a first duplication circuit having a circuit resistance value set to the first resistance value in cooperation with the first output circuit and a second duplication circuit having a circuit resistance value set to the second resistance value in cooperation with the second output circuit. As a result, in the duplication driver, an output of a first test voltage according to the first resistance value set in the first duplication circuit and an output of a second test voltage according to the second resistance value set in the second duplication circuit are enabled. The reference voltage generation unit outputs a plurality of reference voltages. Each of the first selection unit and the second selection unit outputs any reference voltage selected from the plurality of reference voltages outputted from the reference voltage generation unit. The comparison unit outputs a first comparison result signal showing a comparison result of magnitudes of the first test voltage selectively outputted from the first selection unit and a first reference voltage selectively outputted from the second selection unit, during a first operation period. In addition, the comparison unit outputs a second comparison result signal showing a comparison result of magnitudes of the second test voltage selectively outputted from the first selection unit and a second reference voltage selectively outputted from the second selection unit, during a second operation period different from the first operation period. The control unit adjusts the first resistance value of the first duplication circuit and the second resistance value of the second duplication circuit, on the basis of the first and second comparison result signals, to adjust the first resistance value of the first output circuit cooperating with the first duplication circuit and the second resistance value of the second output circuit cooperating with the second duplication circuit. Specifically, the control unit sequentially receives the first comparison result signal and the second comparison result signal outputted from the comparison unit and sets the first and second test voltages, on the basis of the first and second comparison result signals. That is, in setting of the first test voltage, the first test voltage of a voltage level shown by the first comparison result signal is set to a target value according to the first reference voltage or is set within a target range. Meanwhile, in setting of the second test voltage, the second test voltage of a voltage level shown by the second comparison result signal is set to a target value according to the second reference voltage or is set within the target range.

Advantageous Effects of Invention

According to a transmitter according to this embodiment, both suppression of an increase in load capacity in the transmitter according to a high communication speed and suppression of an increase in device occupancy area on a semiconductor substrate due to the suppression of the increase in the load capacity can be realized.

DESCRIPTION OF EMBODIMENTS

[Description of Embodiment of Present Invention]

Figure 1:
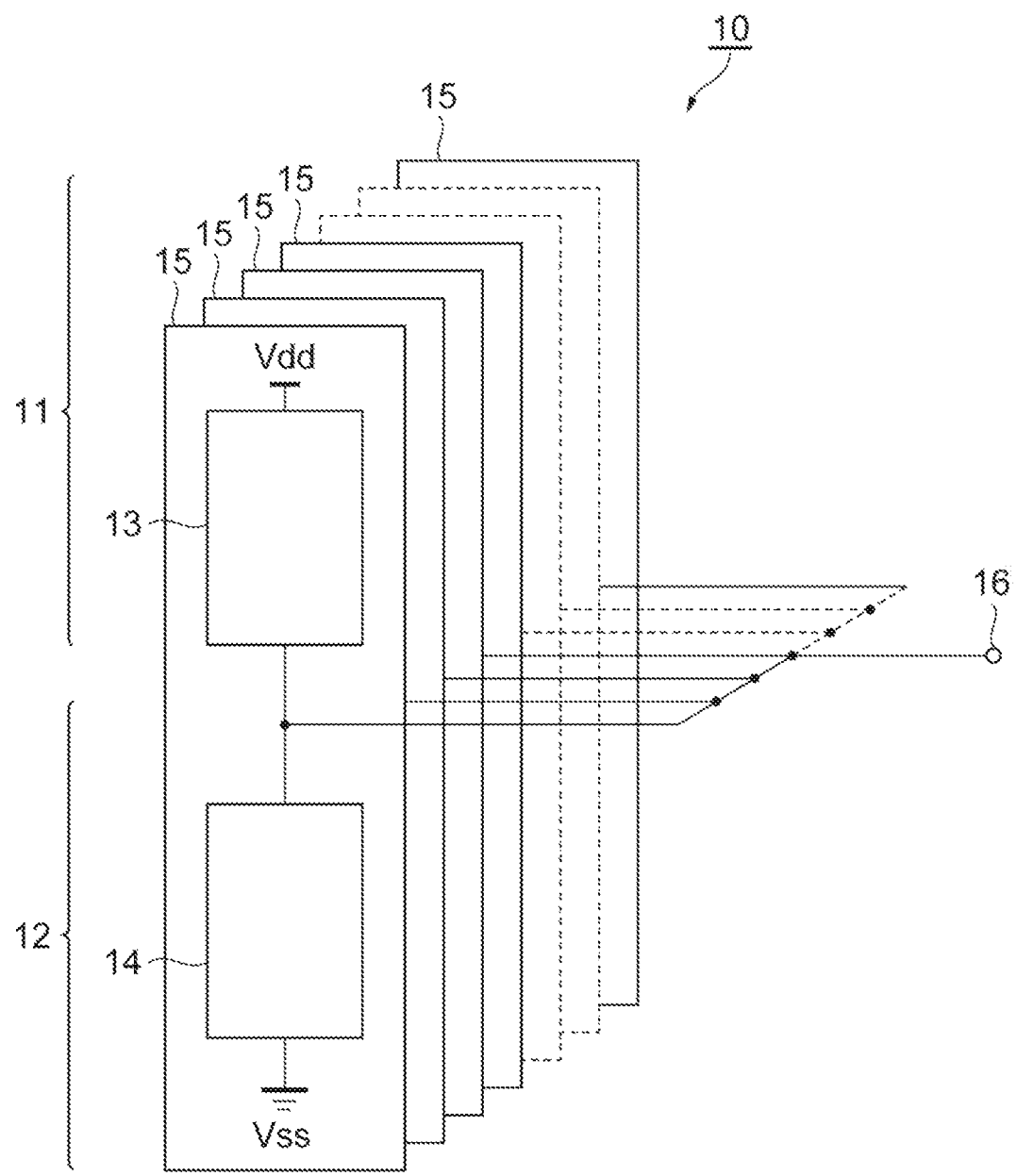
FIG. 1 is a diagram illustrating a configuration of an output driver 10.

First, contents of an embodiment of the present invention are individually enumerated and described.

(1) A transmitter according to this embodiment is an SST transmitter and includes an output driver, a duplication driver, a reference voltage generation unit, a first selection unit, a second selection unit, a comparison unit, and a control unit as a first aspect. The output driver includes a first output circuit and a second output circuit to output a signal from an output terminal. The first output circuit has a structure capable of changing a first resistance value between a first potential terminal and the output terminal. The second output circuit is provided between a second potential terminal and the output terminal and has a structure capable of changing a second resistance value between the second potential terminal and the output terminal. The duplication driver is a duplication of the output driver cooperating with the output driver and includes a first duplication circuit having a circuit resistance value set to the first resistance value in cooperation with the first output circuit and a second duplication circuit having a circuit resistance value set to the second resistance value in cooperation with the second output circuit. As a result, in the duplication driver, an output of a first test voltage according to the first resistance value set in the first duplication circuit and an output of a second test voltage according to the second resistance value set in the second duplication circuit are enabled. The reference voltage generation unit outputs a plurality of reference voltages. Each of the first selection unit and the second selection unit outputs any reference voltage selected from the plurality of reference voltages outputted from the reference voltage generation unit. The comparison unit outputs a first comparison result signal showing a comparison result of magnitudes of the first test voltage selectively outputted from the first selection unit and a first reference voltage selectively outputted from the second selection unit, during a first operation period. In addition, the comparison unit outputs a second comparison result signal showing a comparison result of magnitudes of the second test voltage selectively outputted from the first selection unit and a second reference voltage selectively outputted from the second selection unit, during a second operation period different from the first operation period. The control unit adjusts the first resistance value of the first duplication circuit and the second resistance value of the second duplication circuit, on the basis of the first and second comparison result signals, to adjust the first resistance value of the first output circuit cooperating with the first duplication circuit and the second resistance value of the second output circuit cooperating with the second duplication circuit. Specifically, the control unit sequentially receives the first comparison result signal and the second comparison result signal outputted from the comparison unit and sets the first and second test voltages, on the basis of the first and second comparison result signals. That is, in setting of the first test voltage, the first test voltage of a voltage level shown by the first comparison result signal is set to a target value according to the first reference voltage or is set within a target range. Meanwhile, in setting of the second test voltage, the second test voltage of a voltage level shown by the second comparison result signal is set to a target value according to the second reference voltage or is set within the target range.

(2) As a second aspect applicable to the first aspect, the duplication driver may include a reference resistor provided between the first duplication circuit and the second duplication circuit. In this case, the duplication driver outputs the first test voltage from a connection point of the first duplication circuit and the reference resistor and outputs the second test voltage from a connection point of the second duplication circuit and the reference resistor.

(3) A transmission/reception system according to this embodiment includes the transmitter according to at least one aspect of the first and second aspects and a receiver configured to receive a signal outputted from the transmitter, as an aspect thereof.

Each aspect enumerated in a section of [Description of embodiment of present invention] is applicable to each of the remaining aspects or all combinations of the remaining aspects.

[Details of Embodiment of Present Invention]

Hereinafter, specific structures of a transmitter and a transmission/reception system according to this embodiment will be described in detail with reference to the accompanying drawings. However, it is intended that the present invention is not limited to the exemplary embodiment and all changes within the scope of the appended claims and their equivalents are included in the present invention. In addition, in description of the drawings, the same elements are denoted with the same reference numerals and overlapped explanation is omitted.

After a process in which the present inventors think about the present invention is described, a configuration of the transmitter according to the embodiment is described.

FIG. 1 is a diagram illustrating a configuration of an output driver 10. In the output driver 10 of an SST transmitter, a configuration including a first unit circuit 13 and a second unit circuit 14 is used as one unit (slice 15) and a plurality of slices 15 are connected in parallel. In each of the plurality of slices 15, the first unit circuit 13 is provided between a first potential terminal (power-supply potential terminal Vdd) and an output terminal 16 and the second unit circuit 14 is provided between a second potential terminal (ground potential terminal Vss) and the output terminal 16. The first unit circuit 13 and the second unit circuit 14 may share a partial circuit with each other. The output driver 10 can output a signal from the output terminal 16.

A first output circuit 11 includes the first unit circuit 13 of each of the plurality of slices 15 and is provided between the power-supply potential terminal Vdd and the output terminal 16. A circuit resistance value (first resistance value between the power-supply potential terminal Vdd and the output terminal 16) of the first output circuit 11 is varied and is adjusted by the number of first unit circuits 13 driven among the plurality of first unit circuits 13. In addition, the second output circuit 12 includes the second unit circuit 14 of each of the plurality of slices 15 and is provided between the ground potential terminal Vss and the output terminal 16. A circuit resistance value (second resistance value between the ground potential terminal Vss and the output terminal 16) of the second output circuit 12 is varied and is adjusted by the number of second unit circuits 14 driven among the plurality of second unit circuits 14. That is, the number of slices 15 driven among the plurality of slices 15 is adjusted, so that output impedance of the output driver 10 can be adjusted.

Figure 2:
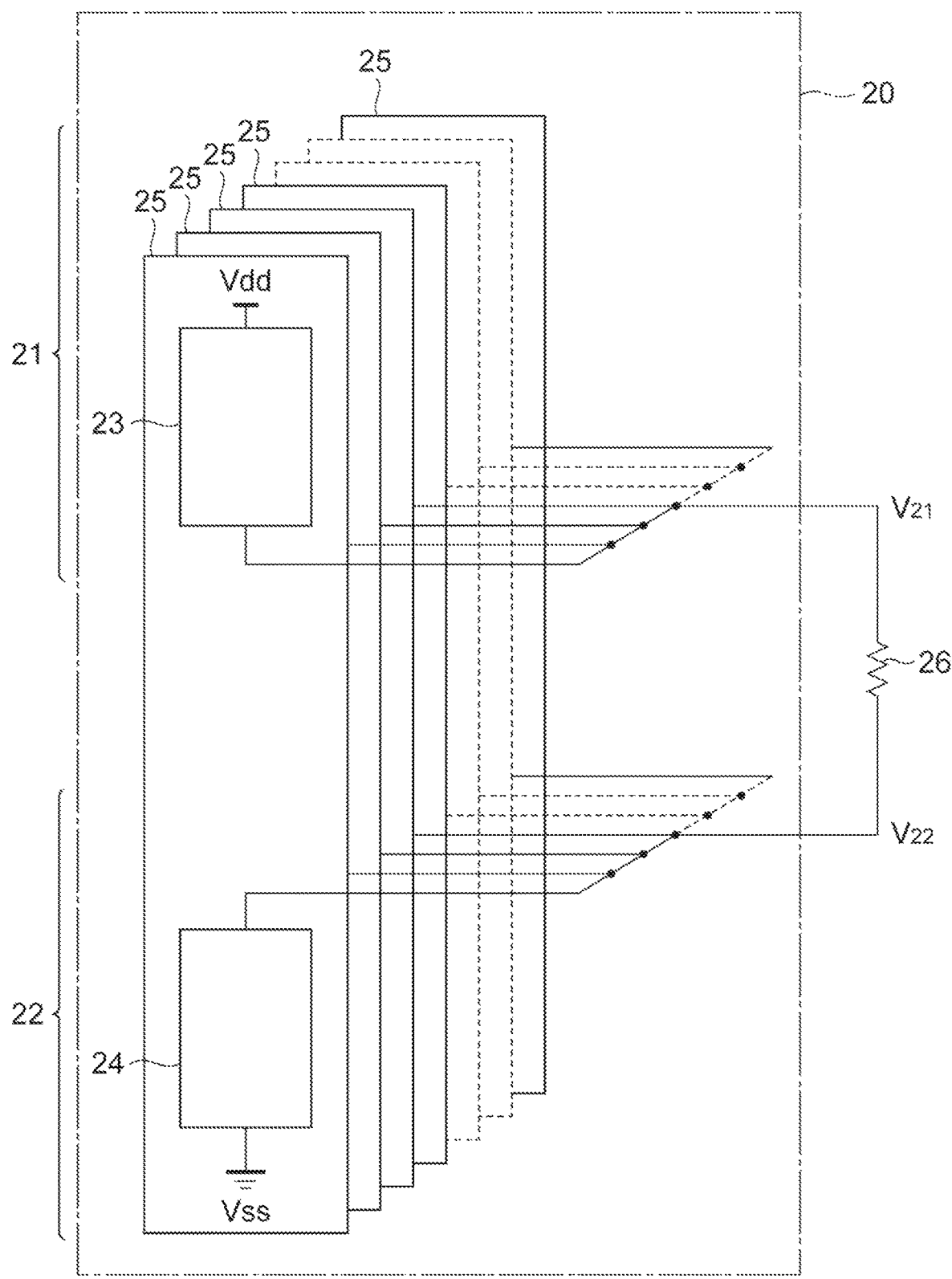
FIG. 2 is a diagram illustrating a configuration of a duplication driver 20.

FIG. 2 is a diagram illustrating a configuration of a duplication driver 20. The duplication driver 20 is used to correct the output impedance of the output driver 10. In the duplication driver 20, a configuration including a first unit circuit 23 and a second unit circuit 24 is used as one unit (slice 25) and a plurality of slices 25 are connected in parallel. The first unit circuit 23 of the duplication driver 20 is a duplication of the first unit circuit 13 of the output driver 10. The second unit circuit 24 of the duplication driver 20 is a duplication of the second unit circuit 14 of the output driver 10.

A first duplication circuit 21 of the duplication driver 20 is a duplication of the first output circuit 11 of the output driver 10. That is, the first duplication circuit 21 includes the first unit circuit 23 of each of the plurality of slices 25 and a circuit resistance value thereof is set to the same value as the circuit resistance value of the first output circuit 11 in cooperation with the first output circuit. Therefore, the resistance value of the first duplication circuit 21 is varied and is adjusted by the number of first unit circuits 23 driven among the plurality of first unit circuits 23.

A second duplication circuit 22 of the duplication driver 20 is a duplication of the second output circuit 12 of the output driver 10. That is, the second duplication circuit 22 includes the second unit circuit 24 of each of the plurality of slices 25 and a circuit resistance value thereof is set to the same value as the circuit resistance value of the second output circuit 12 in cooperation with the second output circuit. Therefore, the resistance value of the second duplication circuit 22 is varied and is adjusted by the number of second unit circuits 24 driven among the plurality of second unit circuits 24.

A reference resistor 26 is provided between the first duplication circuit 21 and the second duplication circuit 22. A voltage of a connection point of the first duplication circuit 21 and the reference resistor 26 is set as a first test voltage $V_{21}$ and a voltage of a connection point of the second duplication circuit 22 and the reference resistor 26 is set as a second test voltage $V_{22}$. The first test voltage $V_{21}$ and the second test voltage $V_{22}$ are values according to the resistance values of the first duplication circuit 21 and the second duplication circuit 22 and are values according to the number of slices 25 driven among the plurality of slices 25.

Therefore, in the SST transmitter, the resistance value of each of the first duplication circuit 21 and the second duplication circuit 22 of the duplication driver 20 is adjusted such that each of the first test voltage $V_{21}$ and the second test voltage $V_{22}$ approaches a target value or is within a target range. In addition, the resistance value of each of the first output circuit 11 and the second output circuit 12 of the output driver 10 is adjusted in the same way in cooperation with a resistance value adjustment operation of each of the first duplication circuit 21 and the second duplication circuit 22. As a result, the output impedance of the output driver 10 can be set to the target value or can be set within the target range.

The conventional SST transmitter described in Patent Documents 1 and 2 includes a first comparison unit comparing the magnitudes of the first test voltage $V_{21}$ and a first reference voltage and a second comparison unit comparing the magnitudes of the second test voltage $V_{22}$ and a second reference voltage, to set each of the first test voltage $V_{21}$ and the second test voltage $V_{22}$ outputted from the duplication driver 20 to the target value or set each of the first test voltage $V_{21}$ and the second test voltage $V_{22}$ within the target range. That is, the conventional SST transmitter includes the two comparison units.

However, when the SST transmitter is configured to correspond to PCI Express (registered trademark) Gen3 or more, an output driver needs to realize about 40 kinds of feed forward equalizer (FFE) strengths. The FFE strength refers to strength of an output voltage to which predistortion to compensate for distortion of a transmission path connected to an output terminal of the output driver in advance is given and is realized by combining pre-emphasis or de-emphasis and pre-shoot (refer to Non-Patent Documents 1 and 2).

For this reason, the output driver configured to correspond to PCI Express Gen3 or more is configured to output many kinds of output voltages and the number of slices tends to increase to adjust the output impedance to the target value or adjust the output impedance within the target range.

Meanwhile, to correspond to next-generation PCI Express Gen4, the output driver needs to be operated at a high speed, for example, 16 Gbps (refer to Non-Patent Document 2) and a load capacity in the SST transmitter is apt to increase according to a high-speed operation of the output driver. For this reason, it is required to suppress an increase in the number of slices of each of the output driver and the duplication driver, to suppress an increase in the load capacity according to the high communication speed.

If the number of slices is decreased, an occupancy area of each of the output driver and the duplication driver decreases when the SST transmitter is formed on a semiconductor substrate. For this reason, it is expected that a manufacturing cost of the SST transmitter decreases. However, according to finding from the inventors, it is obvious that an occupancy area of the entire transmitter on the semiconductor substrate increases and as a result, a manufacturing cost of the SST transmitter increases. This is described in detail later.

If the number of slices of each of the output driver and the duplication driver is small, resolution of the output impedance of the output driver to be set is roughened. Also, resolution of a test voltage outputted from the duplication driver is roughened. In this case, if there is only one reference voltage when the magnitudes of the test voltage outputted from the duplication driver and the reference voltage are compared by the comparison unit, it is determined only whether the test voltage is larger than the reference voltage and the output impedance of the output driver may not satisfy a requirement specification.

Meanwhile, if there are two reference voltages, this is preferable in that it can be determined by the comparison unit whether there is the test voltage between the two reference voltages. However, because the resolution of the test voltage outputted from the duplication driver is rough, it is necessary to increase a difference between the two reference voltages. In this case, because margins between upper and lower limits of the requirement specification of the output impedance of the output driver and the two reference voltages decrease, it is required that the comparison unit has high accuracy (that is, the variation is small and the resolution is high).

In the comparison unit of the high accuracy, a necessary area when the comparison unit is formed on the semiconductor substrate is large. For example, as compared with the SST transmitter disclosed in Patent Document 1, in which a transmission rate of about 3 Gbps is assumed, the necessary area of the comparison unit dramatically increases in an SST transmitter operating at a transmission rate of 16 Gbps. In an actual design example by the inventors, the area of the comparison unit may be larger than the area of the duplication driver.

As described above, if the high communication speed is realized to correspond to PCI Express Gen4, it is required to suppress an increase in the number of slices of each of the output driver and the duplication driver, to suppress an increase in the load capacity in the SST transmitter. This is preferable in that the necessary area of each of the output driver and the duplication driver when the transmitter is formed on the semiconductor substrate decreases. However, because the resolution of the output impedance of the output driver to be set is roughened and the resolution of the test voltage outputted from the duplication driver is also roughened, it is required that the comparison unit has the high accuracy and the necessary area of the comparison unit increases. Therefore, when the transmitter including the output driver, the duplication driver, and the comparison unit is formed on the semiconductor substrate, the entire necessary area increases and a cost increases in some cases. When miniaturization of a semiconductor manufacturing process advances, such a problem becomes remarkable.

Figure 3:
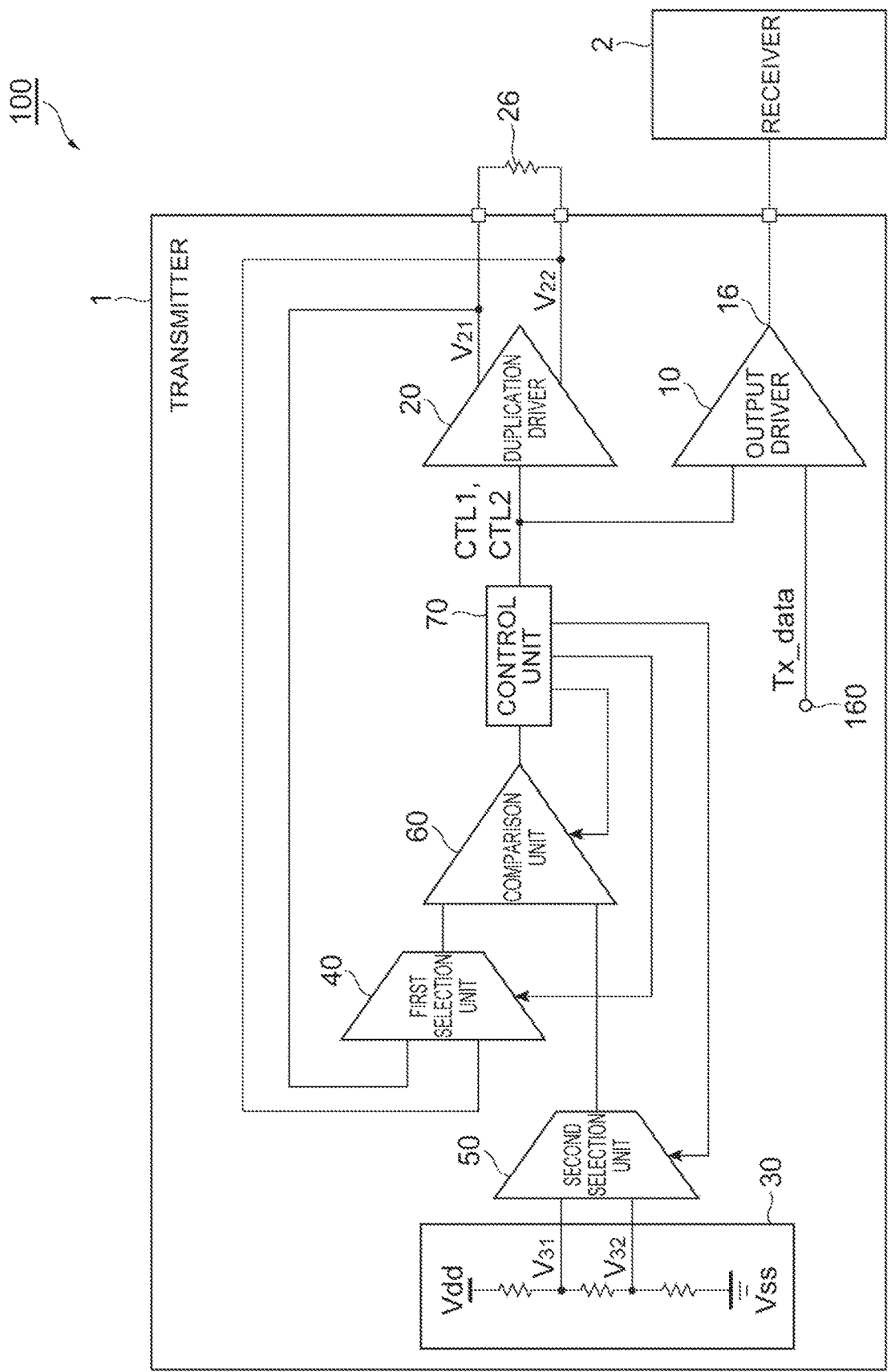
FIG. 3 is a diagram illustrating a configuration of a transmission/reception system 1 including a transmitter 100 and a receiver 2.

This embodiment is based on the finding from the inventors. FIG. 3 is a diagram illustrating a configuration of a transmission/reception system (an example of a transmission/reception system according to this embodiment) 100 that includes a transmitter 1 and a receiver 2. The transmitter 1 according to this embodiment includes the output driver 10, the duplication driver 20, a reference voltage generation unit 30, a first selection unit 40, a second selection unit 50, a comparison unit 60, and a control unit 70.

The output driver 10 has the configuration illustrated in FIG. 1 and outputs a signal Tx_data (signal taken in the output driver 10 through a signal input terminal 160) to be transmitted to the receiver 2, from the output terminal 16. The duplication driver 20 has the configuration illustrated in FIG. 2 and is used to correct the output impedance of the output driver 10 with the reference resistor 26.

The reference voltage generation unit 30 outputs a plurality of reference voltages. The reference voltage generation unit 30 may include a plurality of resistors provided in series between the power-supply potential terminal Vdd and the ground potential terminal Vss. In this case, the reference voltage generation unit 30 can output the plurality of reference voltages generated by dividing resistance by the plurality of resistors.

The first selection unit 40 outputs one test voltage selected from the first test voltage $V_{21}$ and the second test voltage $V_{22}$ outputted from the duplication driver 20, to the comparison unit 60. The second selection unit 50 outputs any reference voltage selected from the plurality of reference voltages outputted from the reference voltage generation unit 30, to the comparison unit 60.

The comparison unit 60 compares the magnitudes of the first test voltage $V_{21}$ selectively outputted from the first selection unit 40 and a first reference voltage $V_{31}$ selectively outputted from the second selection unit 50 and outputs a first selection result signal showing a comparison result. In addition, the comparison unit 60 compares the magnitudes of the second test voltage $V_{22}$ selectively outputted from the first selection unit 40 and a second reference voltage $V_{32}$ selectively outputted from the second selection unit 50 and outputs a second selection result signal showing a comparison result.

For the comparison unit 60, only one comparison unit is provided. The comparison unit 60 performs magnitude comparison of the first test voltage $V_{21}$ and the first reference voltage $V_{31}$ and magnitude comparison of the second test voltage $V_{22}$ and the second reference voltage $V_{32}$ in time division. That is, the magnitude comparison of the first test voltage $V_{21}$ and the first reference voltage $V_{31}$ is performed during a first operation period of the comparison unit 60 and the magnitude comparison of the second test voltage $V_{22}$ and the second reference voltage $V_{32}$ is performed during a second operation period (period temporally different from the first operation period) of the comparison unit 60. The first reference voltage $V_{31}$ compared with the first test voltage $V_{21}$ may have one value. However, the first reference voltage $V_{31}$ may have two values. In addition, the second reference voltage $V_{32}$ compared with the second test voltage $V_{22}$ may have one value. However, the second reference voltage $V_{32}$ may have two values. If the number of reference voltages compared with each test voltage is two, this is preferable because it can be determined by the comparison unit whether there is the test voltage between the two reference voltages.

The control unit 70 controls an operation of each of the first selection unit 40, the second selection unit 50, and the comparison unit 60. In addition, the control unit 70 adjusts resistance values of the first duplication circuit 21 and the second duplication circuit 22 of the duplication driver 20, on the basis of the first comparison result signal and the second comparison result signal outputted from the comparison unit 60, and adjusts resistance values of the first and second output circuits 11 and 12 in the output driver 10 cooperating with the first and second duplication circuits 21 and 22 at the time of setting the resistance values, respectively. Specifically, the control unit 70 sets the first test voltage $V_{21}$ of a voltage level shown by the first comparison result signal to the target value according to the first reference voltage $V_{31}$ or sets the first test voltage $V_{21}$ within the target range. In addition, the control unit 70 sets the second test voltage $V_{22}$ of a voltage level shown by the second comparison result signal to the target value according to the second reference voltage $V_{32}$ or sets the second test voltage $V_{22}$ within the target range. As such, the resistance values of the first output circuit 11 and the second output circuit 12 of the output driver 10 are adjusted, so that the output impedance of the output driver 10 can be set to the target value or can be set within the target range.

Next, a configuration example of each of the slice 15 of the output driver 10 and the slice 25 of the duplication driver 20 will be described. A configuration of each of the output driver 10 and the duplication driver 20 is not limited to a configuration described below and other aspect is also enabled.

Figure 4:
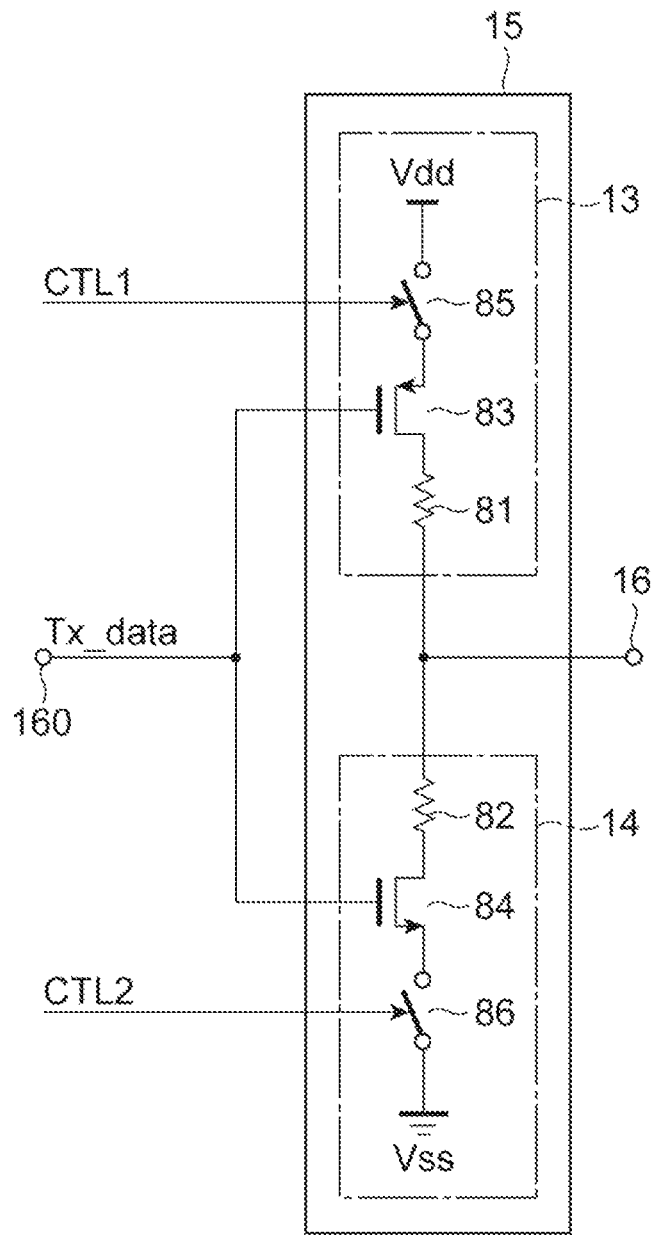
FIG. 4 is a diagram illustrating a first configuration example of a slice 15 of the output driver 10.
Figure 5:
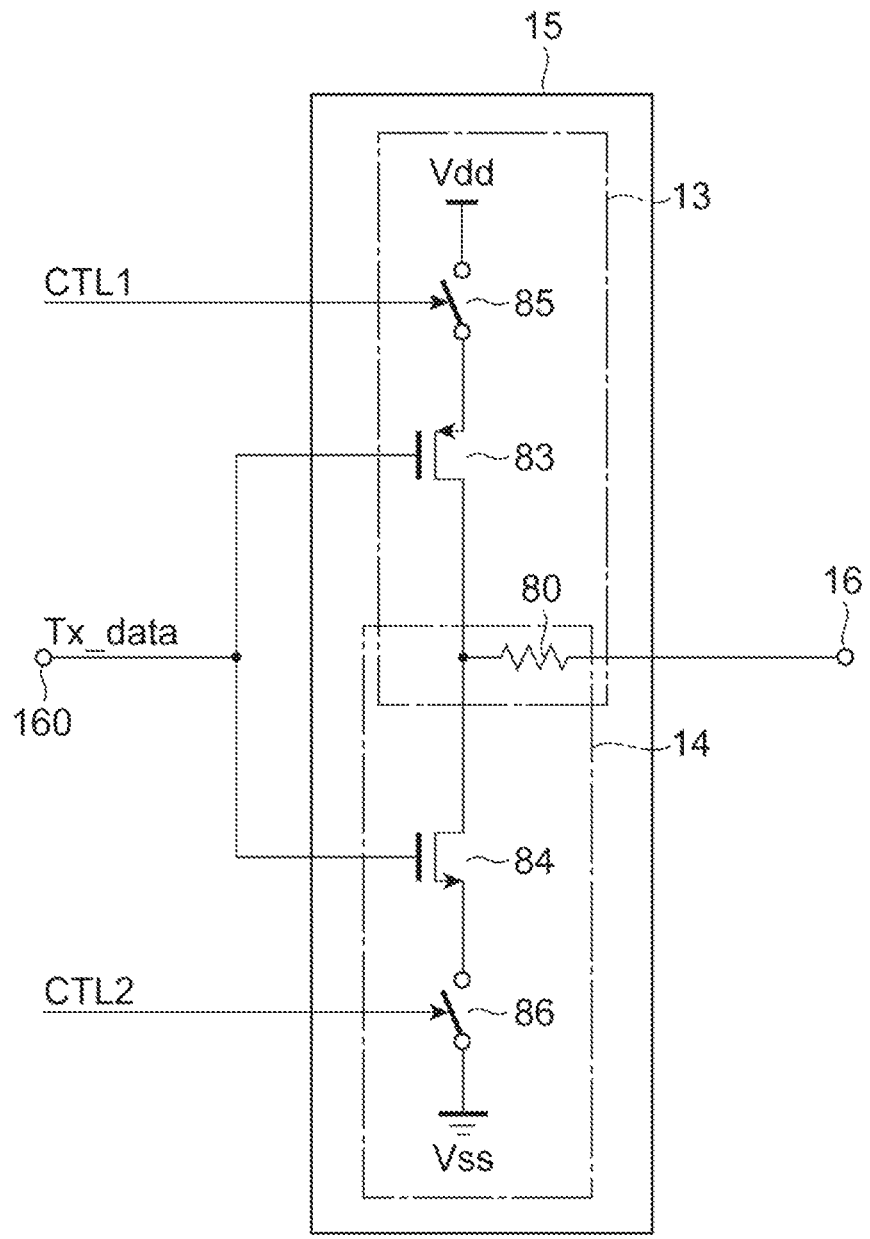
FIG. 5 is a diagram illustrating a second configuration example of the slice 15 of the output driver 10.
Figure 6:
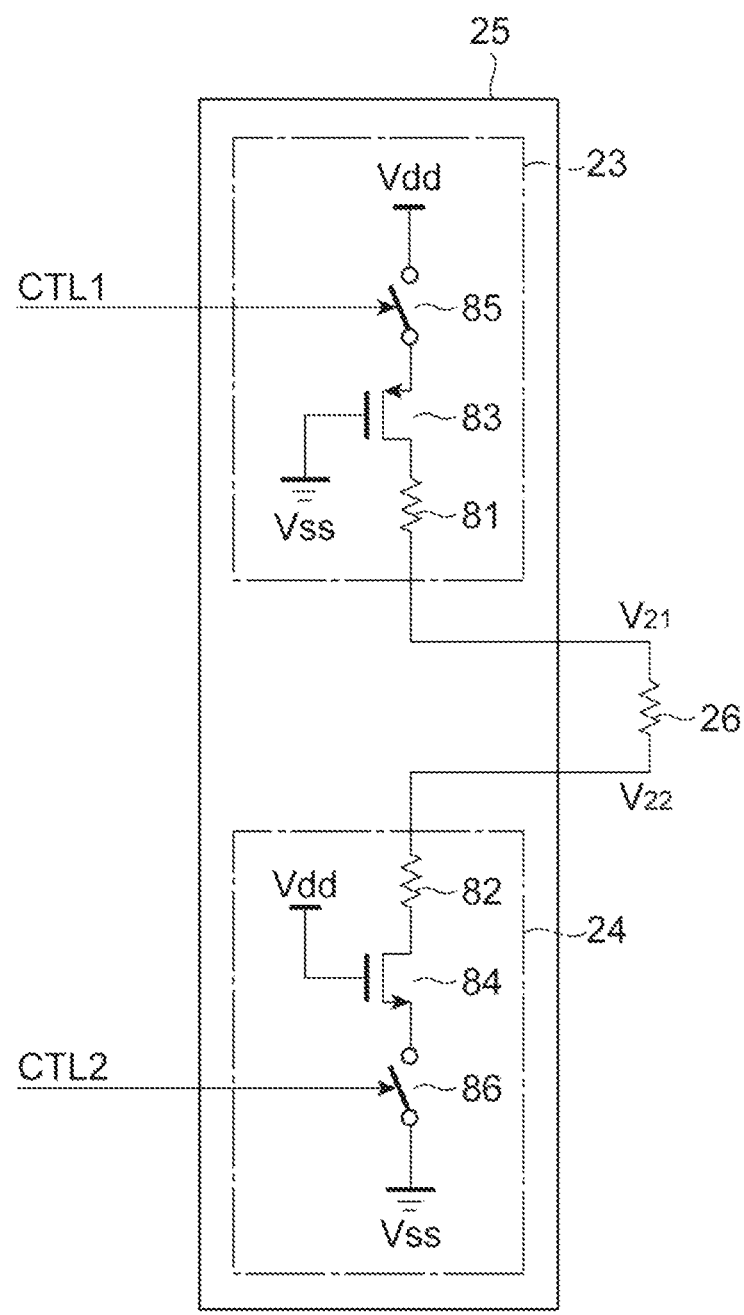
FIG. 6 is a diagram illustrating a configuration example of a slice 25 of the duplication driver 20.

FIG. 4 is a diagram illustrating a first configuration example of the slice 15 of the output driver 10. FIG. 5 is a diagram illustrating a second configuration example of the slice 15 of the output driver 10. FIG. 6 is a diagram illustrating a configuration example of the slice 25 of the duplication driver 20. The slice 25 of the duplication driver 20 illustrated in FIG. 6 is a duplication of the first configuration example and the second configuration example of the slice 15 of the output driver 10.

In the first configuration example of the slice 15 of the output driver 10 illustrated in FIG. 4, in the first unit circuit 13, a switch 85, a PMOS transistor 83, and a resistor (configuring a part of circuit resistance) 81 are provided in series between the first potential terminal (power-supply potential terminal Vdd) and the output terminal 16. In the second unit circuit 14, a switch 86, an NMOS transistor 84, and a resistor (configuring a part of the circuit resistance) 82 are provided in series between the second potential terminal (ground potential terminal Vss) and the output terminal 16.

In the second configuration example of the slice 15 of the output driver 10 illustrated in FIG. 5, in the first unit circuit 13, the switch 85, the PMOS transistor 83, and a resistor 80 are provided in series between the first potential terminal (power-supply potential terminal Vdd) and the output terminal 16. In the second unit circuit 14, a switch 86, the NMOS transistor 84, and the resistor 80 are provided in series between the second potential terminal (ground potential terminal Vss) and the output terminal 16. That is, in the first configuration example, the first unit circuit 13 and the second unit circuit 14 include the resistors 81 and 82, respectively. Meanwhile, in the second configuration example, the first unit circuit 13 and the second unit circuit 14 share the resistor 80 as the part of the circuit resistance.

In both the first configuration example and the second configuration example, an opening/closing state of the switch 85 is set according to a level of a control signal CTL1 given from the control unit 70 to each slice. An opening/closing state of the switch. 86 is set according to a level of a control signal CTL2 given from the control unit 70 to each slice. Each of the switches 85 and 86 can be configured using a single MOS transistor and can be configured using a transfer gate. A signal Tx_data to be transmitted to the receiver 2 is inputted to a gate of each of the PMOS transistor 83 and the NMOS transistor 84 through the signal input terminal 160.

Among the plurality of slices 15 included in the output driver 10, the slices 15 in which the switches 85 and 86 are closed by the control signals CTL1 and CTL2 given from the control unit 70 can output the signal Tx_data. Meanwhile, the slices 15 in which the switches 85 and 86 are opened cannot output the signal Tx_data. For this reason, the connection point of the first unit circuit 13 and the second unit circuit 14 enters a high impedance state. As such, the number of slices 15 driven among the plurality of slices 15 is adjusted by levels of the control signals CTL1 and CTL2 given to the switches 85 and 86 of each of the plurality of slices 15 included in the output driver 10 and the output impedance of the output driver 10 can be adjusted.

In the configuration example of the slice 25 of the duplication driver 20 illustrated in FIG. 6, the first unit circuit 23 to be the duplication of the first unit circuit 13 and the second unit circuit 24 to be the duplication of the second unit circuit 14 are provided. An opening/closing state of the switch 85 is set according to a level of a control signal CTL1 given from the control unit 70 to each slice. An opening/closing state of the switch 86 is set according to a level of a control signal CTL2 given from the control unit 70 to each slice. Both the PMOS transistor 83 and the NMOS transistor 84 are turned on. The reference resistor 26 is provided between the first unit circuit 23 and the second unit circuit 24.

Among the plurality of slices 25 included in the duplication driver 20, in the slices 25 in which the switches 85 and 86 are closed by the control signals CTL1 and CTL2 given from the control unit 70, a current flows from the power-supply potential terminal Vdd to the ground potential terminal. Vss via the reference resistor 26. Meanwhile, in the slices 25 in which the switches 85 and 86 are opened, because the current does not flow, a connection point of the first unit circuit 23 and the second unit circuit 24 enters a high impedance state. As such, the number of slices 25 driven among the plurality of slices 25 is adjusted by levels of the control signals CTL1 and CTL2 given to the switches 85 and 86 of each of the plurality of slices 25 included in the duplication driver 20 and the first test voltage $V_{21}$ and the second test voltage $V_{22}$ change. In addition, as such, the control signals CTL1 and CTL2 are supplied from the control unit 70 to each of the output driver 10 and the duplication driver 20, so that the first output circuit 11 and the first duplication circuit 21 cooperate with each other at the time of setting the resistance values and the second output circuit 12 and the second duplication circuit 22 cooperate with each other at the time of setting the resistance values.

Figure 7:
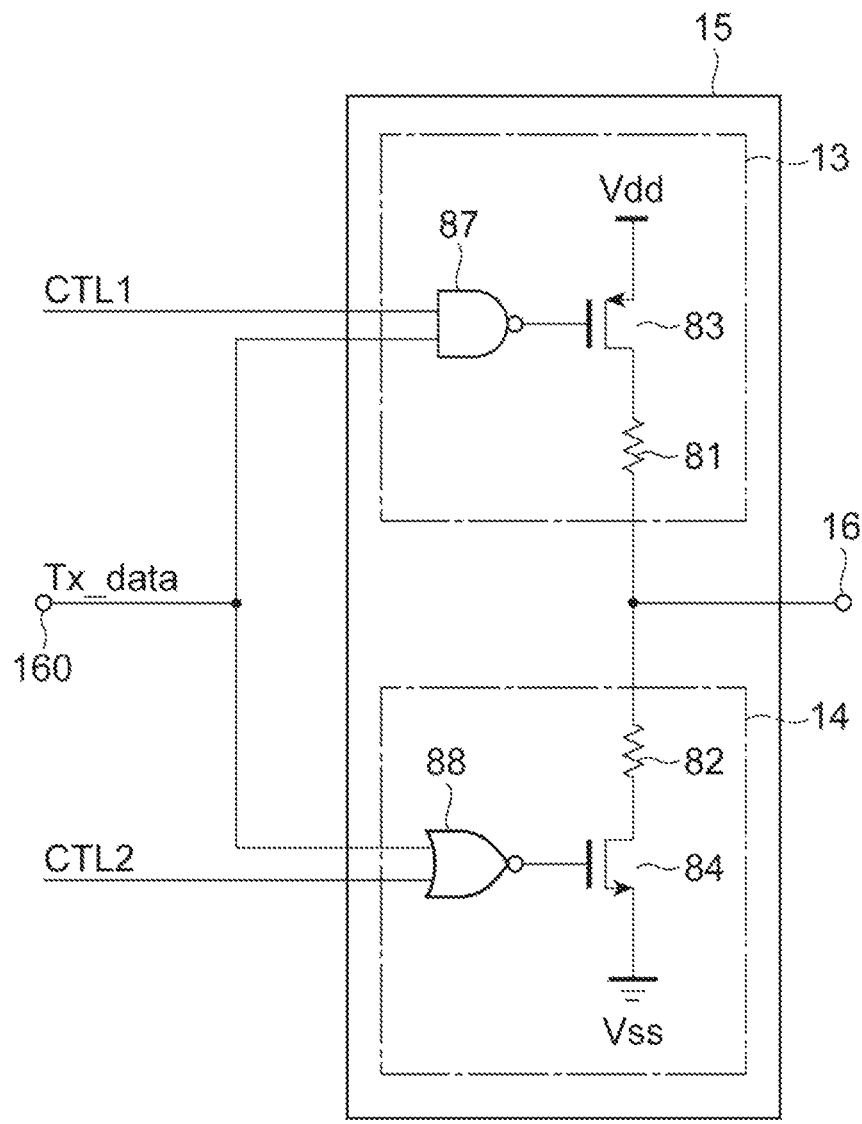
FIG. 7 is a diagram illustrating a third configuration example of the slice 15 of the output driver 10.
Figure 8:
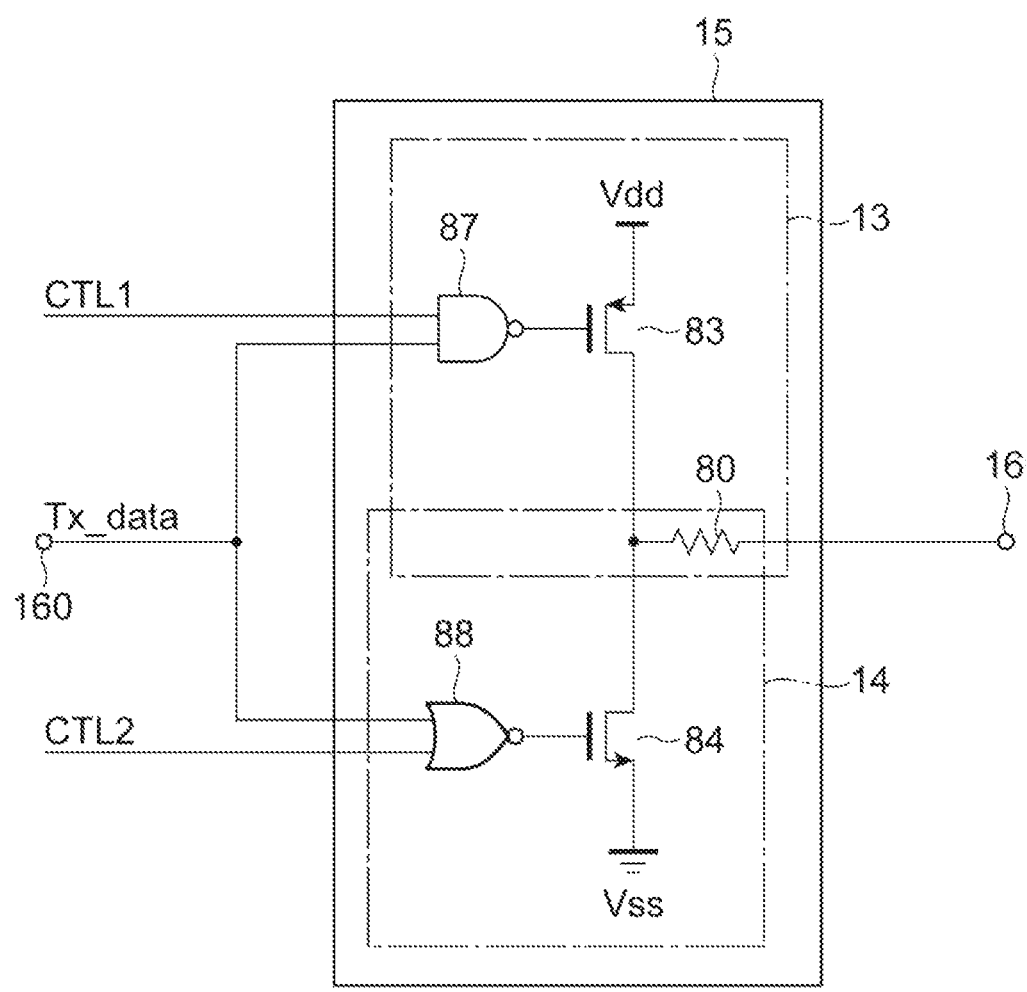
FIG. 8 is a diagram illustrating a fourth configuration example of the slice 15 of the output driver 10.
Figure 9:
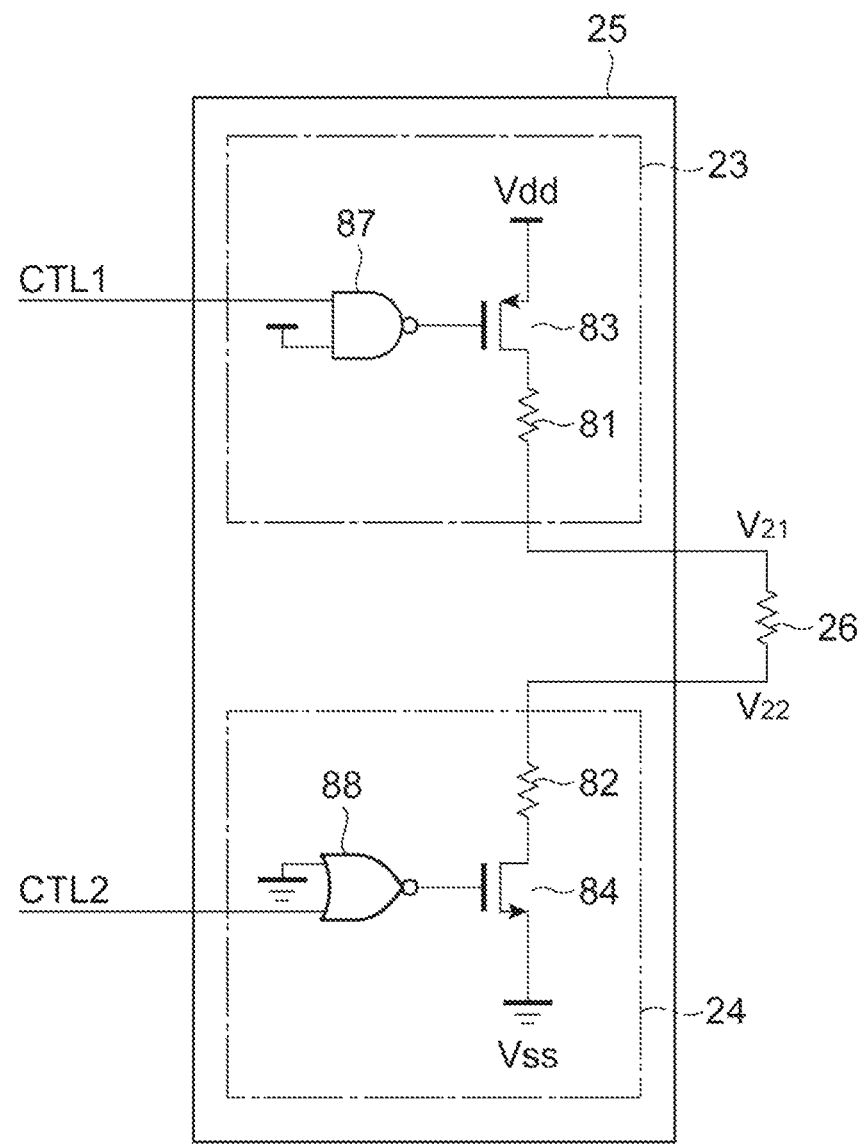
FIG. 9 is a diagram illustrating a configuration example of the slice 25 of the duplication driver 20.

FIG. 7 is a diagram illustrating a third configuration example of the slice 15 of the output driver 10. FIG. 8 is a diagram illustrating a fourth configuration example of the slice 15 of the output driver 10. FIG. 9 is a diagram illustrating a configuration example of the slice 25 of the duplication driver 20. The slice 25 of the duplication driver 20 illustrated in FIG. 9 is a duplication of the third configuration example and the fourth configuration example of the slice 15 of the output driver 10.

In the configuration examples of FIGS. 4 to 6 described above, it is set whether the individual slices 15 and 25 are driven, by the opening/closing states of the switches 85 and 86 based on the levels of the control signals CTL1 and CTL2. Meanwhile, in the configuration examples of FIGS. 7 to 9, it is set whether the individual slices 15 and 25 are driven, by output levels of gate circuits 87 and 88 based on the levels of the control signals CTL1 and CTL2.

In the slice 15 of the output driver 10 illustrated in FIG. 7 or 8, the first gate circuit 87 can set the signal given to the gate of the PMOS transistor 83 as any one of the transmission signal Tx_data (signal given through the signal input terminal 160) and a high level, according to the level of the control signal CTL1. The second gate circuit 88 can set the signal given to the gate of the NMOS transistor 84 as any one of the transmission signal Tx_data and a low level, according to the level of the control signal CTL2.

Among the plurality of slices 15 included in the output driver 10, the slices 15 in which the signal Tx_data is inputted to the gates of the PMOS transistor 83 and the NMOS transistor 84 by the control signals CTL1 and CTL2 given from the control unit 70 can output the signal Tx_data. Meanwhile, the slices 15 in which a high level is given to the gate of the PMOS transistor 83 and a low level is given to the gate of the NMOS transistor 84 cannot output the signal Tx_data. For this reason, a connection point of the first unit circuit 13 and the second unit circuit 14 enters a high impedance state. As such, the number of slices 15 driven among the plurality of slices 15 is adjusted by levels of the control signals CTL1 and CTL2 given to the first gate circuit 87 and the second gate circuit 88 of each of the plurality of slices 15 included in the output driver 10 and the output impedance of the output driver 10 can be adjusted.

In the slice 25 of the duplication driver 20 illustrated in FIG. 9, the first gate circuit 87 can set the signal given to the gate of the PMOS transistor 83 as any one of the low level and the high level, according to the level of the control signal CTL1. The second gate circuit 88 can set the signal given to the gate of the NMOS transistor 84 as any one of the high level and the low level, according to the level of the control signal CTL2.

Among the plurality of slices 25 included in the duplication driver 20, in the slices 25 in which the low level is given to the gate of the PMOS transistor 83 and the high level is given to the gate of the NMOS transistor 84, by the control signals CTL1 and CTL2 given from the control unit 70, a current flows from the power-supply potential terminal Vdd to the ground potential terminal Vss via the reference resistor 26. Meanwhile, in the slices 25 in which the high level is given to the gate of the PMOS transistor 83 and the low level is given to the gate of the NMOS transistor 84, the current does not flow and a connection point of the first unit circuit 23 and the second unit circuit 24 enters a high impedance state. As such, the number of slices 25 driven among the plurality of slices 25 is adjusted by levels of the control signals CTL1 and CTL2 given to the first gate circuit 87 and the second gate circuit 88 of each of the plurality of slices 25 included in the duplication driver 20 and the first test voltage $V_{21}$ and the second test voltage $V_{22}$ change.

In the conventional example, in the case in which the speed is increased in the communication using the SST transmitter, if the number of slices of each of the output driver and the duplication driver is decreased to suppress the increase in the load capacity in the SST transmitter, the area of the comparison unit increases and the device occupancy area of the entire SST transmitter on the semiconductor substrate also increases. Meanwhile, according to this embodiment, because only one comparison unit may be provided, the device occupancy area on the semiconductor substrate can be decreased and a manufacturing cost and consumption power of the device can be reduced.

REFERENCE SIGNS LIST

1 . . . transmitter; 2 . . . receiver; 10 . . . output driver; 11 . . . first output circuit; 12 . . . second output circuit; 13 . . . first unit circuit; 14 . . . second unit circuit; 15 . . . slice; 16 . . . output terminal; 20 . . . duplication driver; 21 . . . first duplication circuit; 22 . . . second duplication circuit; 23 . . . first unit circuit; 24 . . . second unit circuit; 25 . . . slice; 26 . . . reference resistor; 30 . . . reference voltage generation unit; 40 . . . first selection unit; 50 . . . second selection unit; 60 . . . comparison unit; 70 . . . control unit; 80 82 . . . resistor; 83 . . . PMOS transistor; 84 . . . NMOS transistor; 85, 86 . . . switch; 87 . . . first gate circuit; 88 . . . second gate circuit; 100 . . . transmission/reception system; and 160 . . . signal input terminal.

The invention claimed is:

1. A transmitter comprising:
an output driver configured to include a first output circuit and a second output circuit and output a signal from an output terminal, the first output circuit being provided between a first potential terminal and the output terminal and configured to change a first resistance value between the first potential terminal and the output terminal, the second output circuit being provided between a second potential terminal and the output terminal and configured to change a second resistance value between the second potential terminal and the output terminal;
a duplication driver configured to include a first duplication circuit and a second duplication circuit and having output terminals for an output of a first test voltage according to the first resistance value and an output of a second test voltage according to the second resistance value, the first duplication circuit being a duplication of the first output circuit and having a circuit resistance value set to the first resistance value in cooperation with the first output circuit, the second duplication circuit being a duplication of the second output circuit and having a circuit resistance value set to the second resistance value in cooperation with the second output circuit;
a reference voltage generation unit configured to output a plurality of reference voltages;
a first selection unit connected to a control unit, the first selection unit having input terminals respectively connected to the output terminals of the duplication driver, and an output terminal, wherein the control unit controls the first selection unit and the first selection unit outputs one test voltage of the first test voltage and the second test voltage;
a second selection unit connected to the control unit, the second selection unit having input terminals respectively connected to the reference voltage generation unit, and an output terminal, wherein the control unit controls the second selection unit and the second selection unit outputs any reference voltage of the plurality of reference voltages;
a comparison unit connected to the control unit, the comparison unit having input terminals respectively connected to the output terminals of the first selection unit and the second selection unit, and an output terminal, wherein the control unit controls the comparison unit and the comparison unit outputs a first comparison result signal showing a comparison result of magnitudes of the first test voltage selectively outputted from the first selection unit and a first reference voltage selectively outputted from the second selection unit, during a first operation period, and outputs a second comparison result signal showing a comparison result of magnitudes of the second test voltage selectively outputted from the first selection unit and a second reference voltage selectively outputted from the second selection unit, during a second operation period different from the first operation period; and the control unit having an input terminal connected to the output terminal of the comparison unit, and an output terminal connected to the output driver and the duplication driver, wherein the control unit adjusts the circuit resistance values of the first and second duplication circuits on the basis of the first comparison result signal and the second comparison result signal outputted from the comparison unit, and adjusts the first and second resistance values of the first and second output circuits cooperating with the first and second duplication circuits respectively.

2. The transmitter according to claim 1, wherein the duplication driver includes a reference resistor provided between the first duplication circuit and the second duplication circuit, outputs the first test voltage from a connection point of the first duplication circuit and the reference resistor, and outputs the second test voltage from a connection point of the second duplication circuit and the reference resistor.

3. A transmission/reception system comprising:
the transmitter according to claim 1; and
a receiver configured to receive a signal outputted from the transmitter.

4. A transmission/reception system comprising:
the transmitter according to claim 2; and
a receiver configured to receive a signal outputted from the transmitter.

* * * * *